United States Patent [19]

Nakamaki et al.

[11] Patent Number: 4,888,994
[45] Date of Patent: Dec. 26, 1989

[54] METHOD OF CARRYING OBJECTS INTO AND FROM A FURNACE, AND APPARATUS FOR CARRYING OBJECTS INTO AND FROM A FURNACE

[75] Inventors: Shin Nakamaki, Machida; Yuzuru Sasahara, Hachioji, both of Japan

[73] Assignee: Tel Sagami Limited, Kanagawa, Japan

[21] Appl. No.: 273,063

[22] Filed: Nov. 18, 1988

[30] Foreign Application Priority Data

Nov. 18, 1987 [JP] Japan .............................. 62-289408

[51] Int. Cl.$^4$ ................................................. G01B 5/30
[52] U.S. Cl. ...................................... 73/760; 414/161
[58] Field of Search ................ 73/760, 862.54, 862.65; 414/161, 180, 183; 432/32, 36, 239

[56] References Cited

U.S. PATENT DOCUMENTS

| | | | |
|---|---|---|---|
| 3,744,650 | 7/1973 | Henebry et al. | 214/23 |
| 4,008,815 | 2/1977 | Fisk | 214/17 C |
| 4,439,146 | 3/1984 | Sugita | 432/253 |
| 4,440,538 | 4/1984 | Bowers | 414/183 |
| 4,468,195 | 8/1984 | Sasaki et al. | 432/36 |
| 4,557,657 | 12/1985 | Olson et al. | 414/180 |
| 4,620,832 | 11/1986 | Cay | 414/786 |
| 4,671,726 | 6/1987 | Thuen | 414/180 X |
| 4,752,219 | 6/1988 | Fisher, Jr. | 432/253 |

FOREIGN PATENT DOCUMENTS

| | | |
|---|---|---|
| 61-12230 | 1/1986 | Japan . |
| 61-55335 | 4/1986 | Japan . |
| 61-151340 | 9/1986 | Japan . |

OTHER PUBLICATIONS

Richard S. Rosler et al., "Automation in CVD Processing", Solid State Technology/ Jul. 1977, pp. 27–33.
W. C. Benzing and R. Fisk, "Automation in CVD Wafer Processing", Solid State Technology/Jan. 1975, pp. 39–42.

Primary Examiner—Jerry W. Myracle
Attorney, Agent, or Firm—Oblon, Spivak, McClelland, Maier & Neustadt

[57] ABSTRACT

A method of carrying a boat, on which a number of wafers are mounted, into and from a furnace using a soft-landing loader having a fork. In this method, before loading the boat into the furnace, the reaction applied on the fork at a specific point is measure while the fork is supporting the boat, and the reaction thus measured is stored in a memory. The fork is inserted into, then pulled out of the furance, thus loading the boat and leaving it within the furnace. The wafers are heat-treated within the furnace, then, the fork is inserted again, and raises the wafer boat within the furnace. The reaction applied on the fork at this time is measured, and compared with the value stored in the memory. When it is not equal to the value stored in the memory, the fork is lowered and moved slightly back or forth, and then raised again to support the boat, repeating this motion until the reaction applied on the fork becomes equal to the value stored in the memory. After the compared both reactions have been found equal, the fork is pulled out of the furnace, thereby unloading the boat therefrom.

16 Claims, 6 Drawing Sheets

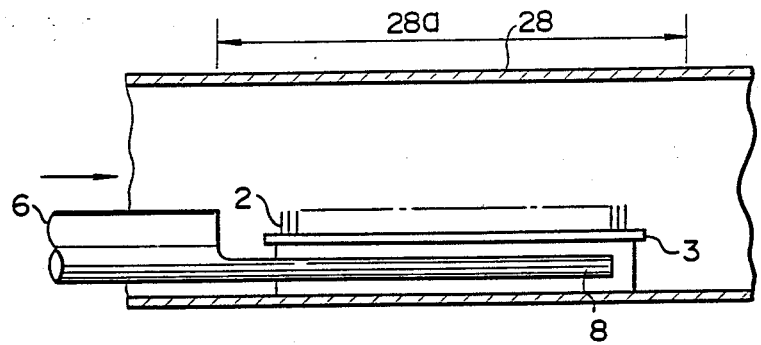
F I G. 12
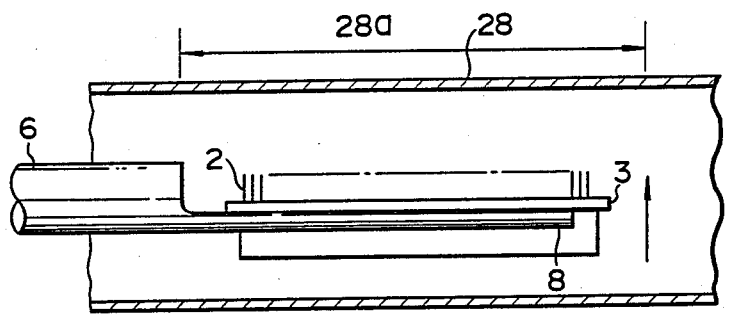
F I G. 13
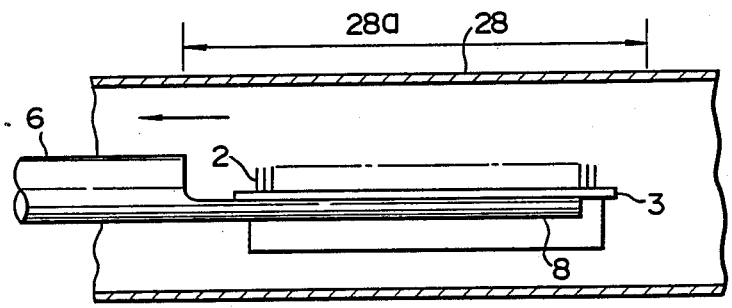
F I G. 14

METHOD OF CARRYING OBJECTS INTO AND FROM A FURNACE, AND APPARATUS FOR CARRYING OBJECTS INTO AND FROM A FURNACE

BACKGROUND OF THE INVENTION

1. Field of the Invention

The present invention relates to a method of carrying a boat supporting a number of objects such as semiconductor wafers, into and out of a thermal treatment furnace. It also relates to an apparatus for carrying a boat supporting semiconductor wafers, into and out of a thermal treatment furnace.

2. Description of the Related Art

Semiconductor devices, such as ICs and LSIs, are manufactured by performing various processes on semiconductor wafers sliced from an ingot. Among these processings are: treating the surface of each wafer; diffusing impurities into the wafer; depositing layers on the wafer; and etching the layers. These processings involve heating the wafer. Hence, each wafer is heat-treated several times during the manufacture of the semiconductor devices.

Generally, to heat-treat semiconductor wafers, use is made of a so-called multi-stage furnace, which comprises two or more furnace units mounted one upon another, for example, a four-stage furnace. Each furnace unit contains a process tube made of quartz and positioned horizontally. A soft-landing loader is located in front of each furnace unit, for loading a boat (hereinafter called "wafer boat"), which supports wafers, into the process tube, and unloading the wafer boat from the process tube.

Various types of soft-landing loaders are disclosed in Japanese Patent Laid-Open No. 62-3571, U.S. Pat. No. 4,008,815, and U.S. Pat. No. 4,468,195. Each of these soft-landing loaders comprises a fork. The fork extends toward the entrance of a process tube, in the axial direction of the tube (hereinafter referred to as "X-axis direction). The fork is shaped like a hollow, and has a distal end so shaped as to support a wafer boat stably.

The soft-landing loader further comprises an X-axis drive mechanism for moving the fork in the X-axis direction, a $\theta$-oscillation mechanism for oscillating the distal end of the fork up and down, a controller for controlling the movement of the fork, and a computer system for controlling the controller in accordance with a specific program.

The wafer boat is loaded into the process tube in the following way. First, the X-axis drive mechanism is operated, thereby moving the fork toward the tube for a predetermined distance L. Then, the $\theta$-oscillation mechanism is operated, thus slowly oscillating downward the distal end of the fork, whereby the wafer boat slides from the fork into the process tube. The wafer boat is unloaded from the process tube in the following manner. First, the X-axis drive mechanism is operated, thereby moving the fork into the process tube. Then, the $\theta$-oscillation drive mechanism is operated such that the distal end of the fork is slowly oscillated upward, thus holding and lifting the wafer boat upward. Finally, the X-axis drive mechanism is actuated, and moves the fork away from the tube for the predetermined distance L. During the loading and unloading of the wafer boat, the controller controls the fork such that the fork is kept out of contact with the inner wall of the process tube which is made of quartz. Since the fork does not rub the inner wall of the tube, no quartz powder comes off the inner wall of the tube and attaches to the semiconductor wafers mounted on the wafer boat.

In the conventional method of loading the wafer boat into the process tube, and unloading the boat from the process tube, however, the fork and the wafer boat assume one positional relationship during the loading of the boat, and take another positional relationship during the unloading of the boat. This is inevitably because the $\theta$-oscillation mechanism inclines the wafer boat which is inclined to the axis of the process tube when the boat is loaded into the process tube, and also because the X-axis drive mechanism does not always move the boat in the same way in both loading and unloading the wafer boat. Consequently, the unloaded wafer boat takes a position different from the position it assumed before being loaded into the process tube. Unless the boat is placed in the same position as it was before loaded into the process tube, it cannot be easily transported to the position where the wafers mounted on it will undergo the next processing.

SUMMARY OF THE INVENTION

It is, therefore, an object of the present invention to provide a method of carrying a wafer boat into and out of a process tube, maintaining the wafer boat and the fork of a soft-landing loader in the same positional relationship before loading the boat into the process tube and after unloading the boat from the process tube.

Another object of the invention is to provide a soft-landing loader which can carry a wafer boat into and out of a process tube, maintaining the wafer boat and the fork in the same positional relationship before loading the boat into the process tube and after unloading the boat out of the process tube.

According to an aspect of the present invention, there is provided a method of carrying an object into and from a thermal treatment furnace, said method comprising the steps of: measuring the first physical transformation amount applied on a loading/unloading means supporting the object before the object is loaded into the thermal treatment furnace; measuring the second physical transformation amount being applied on the loading/unloading means after wafers mounted on the object have been thermally treated in the furnace; comparing the second physical transformation amount with the first physical transformation amount; changing the position at which the object is mounted on the loading-/unloading means, until the second physical transformation amount becomes equal to the first physical transformation amount; and unloading the object from the thermal treatment furnace after the second physical transformation amount has become equal to the first physical transformation amount.

According to another aspect of the invention, there is provided an apparatus for carrying an object into and from a thermal treatment furnace, said apparatus comprising: loading/unloading means for loading an object into, and unloading an object from, the thermal treatment furnace; physical transformation amountmeasuring means for measuring a first physical transformation amount applied on a loading/unloading means supporting the object before the object is loaded into the furnace, and also measuring a second physical transformation amount being applied on the loading/unloading means after wafers mounted on the object have been thermally treated in the furnace; comparing means for comparing the second physical transformation amount with the first physical transformation amount; and positionchanging means for changing the position at which the object is mounted on the loading/unloading means, until the second physical transformation amount becomes equal to the first physical transformation amount, said loading/unloading means unloading the object from the thermal treatment furnace after the second physical transformation amount has become equal to the first physical transformation amount.

Preferably, the physical transformation amount is the reaction which is applied on the loading/unloading means. The reaction is measured by means of a pressure sensor. Alternatively, the physical transformation amount can be measured in the form of the strain on the object-supporting member of the loading/unloading means as it supports the object. If this is the case, the strain is measured by means of a strain gauge.

According to the present invention, the object is a boat made of quartz, on which a number of semiconductor wafers are mounted. Further, the loading/unloading means is a soft-landing loader having a fork made of quartz. The soft-landing loader comprises an X-axis drive mechanism for moving the fork back and forth, and a $\theta$-oscillation mechanism for oscillating the fork. It is desirable that both mechanisms are controlled by a computer system.

Preferably, the X-axis drive mechanism of the soft-landing loader has a converter which converts the rotation of a drive shaft to the linear motion of a slider. the drive shaft can be a ball screw. Nonetheless, a friction shaft, which has no screw portions, may better be used as the drive shaft.

The $\theta$-oscillation drive mechanism is a lever mechanism. It is desirable that an eccentric can be fastened to the lever at the point of application of the lever. The lever mechanism can be a crank mechanism, which is one of the various types of linkages.

BRIEF DESCRIPTION OF THE DRAWINGS

FIGS. 12, 13 and 14 are diagrams explaining how the loader operates, unloading the wafer boat out of the process tube.

DETAILED DESCRIPTION OF THE PREFERRED EMBODIMENTS

Various embodiments of the present invention will now be described in detail, with reference to the drawings attached hereto.

Figure 1:
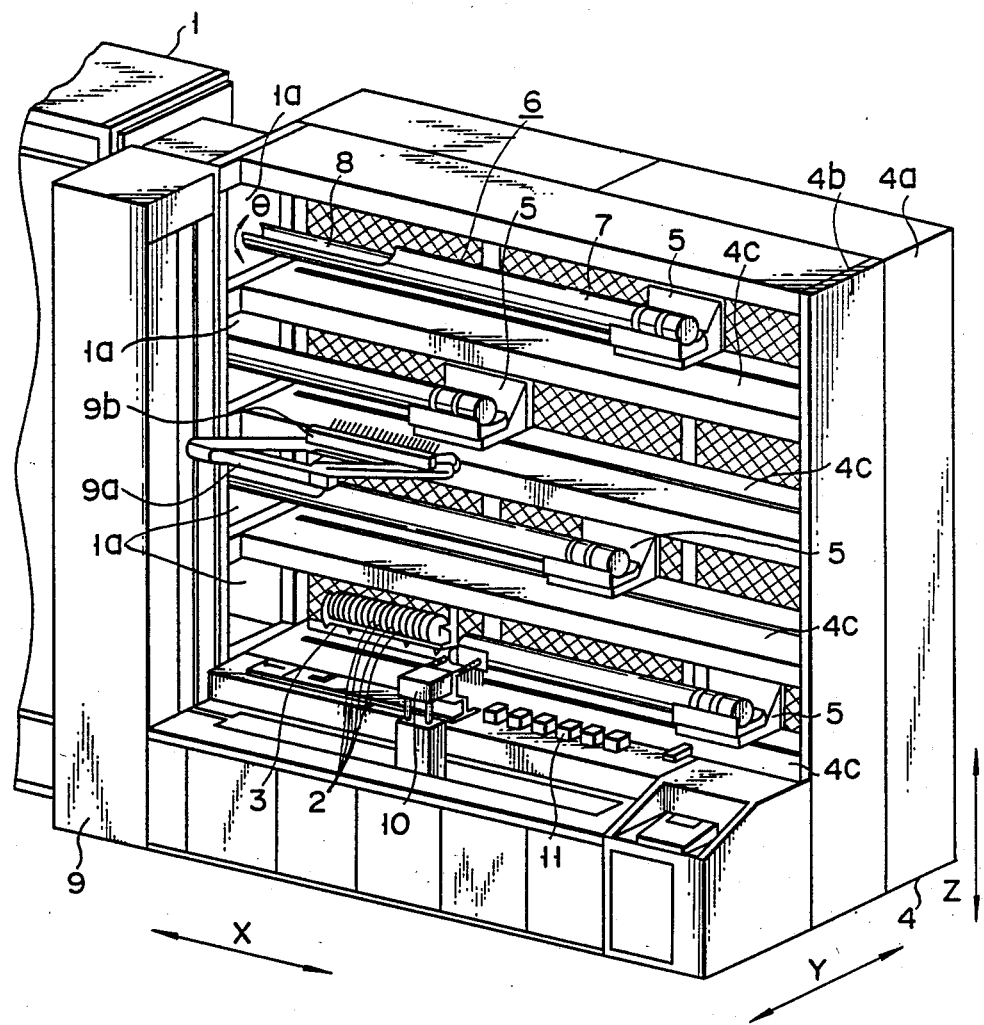
FIG. 1 is a perspective view showing a thermal treatment furnace, and illustrating, in detail, the various components located at the entrance of the furnace.

FIG. 1 shows thermal treatment furnace 1 to which the present invention is applied. This furnace 1 is a multi-stage one comprising four furnace units (not shown), mounted one upon another. Furnace 1 is designed to oxidize silicon wafers and diffuse impurities into the wafers. Each furnace unit contains one process tube arranged horizontally.

Boat loading/unloading unit 4 is located in front of the entrance 1a of thermal treatment furnace 1. This unit 4 comprises filter section 4a having an air filter and boat loading/unloading section 4b for loading wafer boat 3 into and unloading boat 3 from furnace 1. Boat 3 is designed to support a number of wafers 2. Boat loading/unloading section 4b has four shelves 4c. One end of each shelf 4c extends into entrance 1a of thermal treatment furnace 1.

As is shown in FIG. 1, four soft-landing loaders 5 are mounted on four shelves 4c, respectively. Each of these soft-landing loaders 5 has fork 6 made of quartz. Forks 6 extend in the axial direction of thermal treatment furnace 1, and hence parallel to one another. Each fork 6 consists of a proximal portion, or cylindrical portion 7, and a distal portion, or boat-supporting portion 8.

Elevator 9 is arranged between thermal treatment furnace 1 and boat loading/unloading unit 4. Elevator 9 has arm 9a and boat-transferring member 9b. Member 9b is attached to the distal end of arm 9a, for transferring any wafer boat 3 from shelf 4c onto boat-supporting portion 8 of fork 6. Elevator 9 has a mechanism for moving member 9b along both X-axis and Y-axis.

A stage for supporting wafer cassettes 11 and wafer boats 3 is located in front of the lowest shelf 4c of boat loading/unloading section 4b. Handling device 10 is arranged in front of this stage. Handling device 10 has two mechanisms, one for moving wafers 2 from cassettes 11, and the other for placing the wafers onto wafer boat 3.

One of the soft-landing loaders 5, which are identical, will be described in detail, with reference to FIG. 2 in which fork 6 is not shown for the sake of simplicity.

Figure 2:
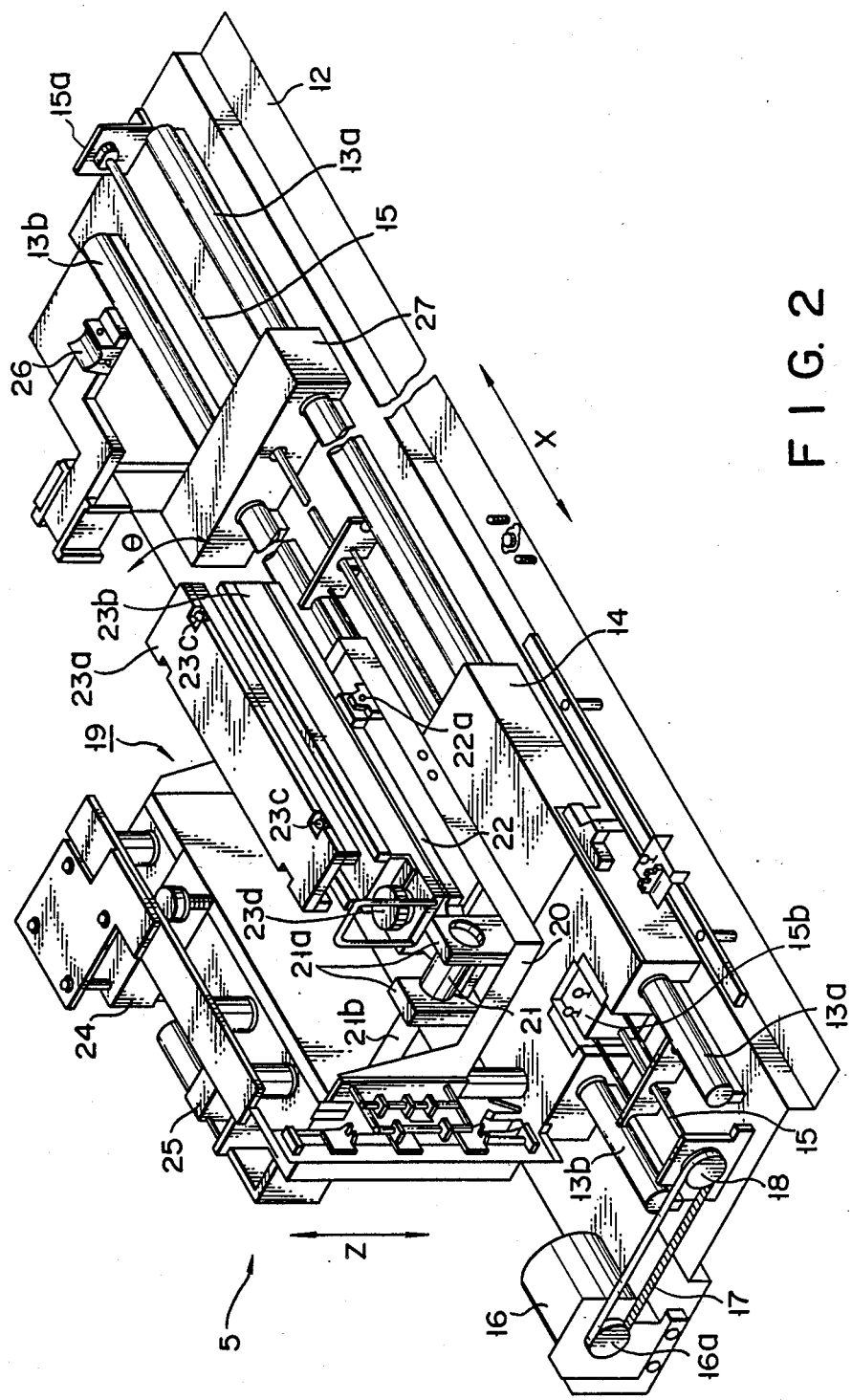
FIG. 2 is a perspective view showing a soft-landing loader (the form not shown) according to an embodiment of the present invention.

As is shown in FIG. 2, guide rails 13a and 13b are fixed on base 12 of shelf 4c. Drive shaft 15 horizontally extends, with its one end rotatably supported by stopper 15a fixed on base 12, and its other end coupled to pulley 18. Guide rails 13a and 13b and drive shaft 15 extend parallel, along the X-axis. Both rails 13a and 13b pass through first slider 14, whereas drive shaft 15 passes through second slider 27. Motor 16 is mounted on base 12, and pulley 16a is mounted on the shaft of this motor 16. Timing belt 17 is wrapped around pulley 16a and pulley 18 mounted on drive shaft 15. Drive shaft 15 is connected to first slider 14 by means of converter 15b. Converter 15b contains a friction member which converts the rotation of shaft 15 to the linear motion of first slider 14. Second slider 27 has a similar converter, and is used to support the distal end of fork 6.

Also, as is illustrated in FIG. 2, fork-supporting section 19, which is adapted to support one end of fork 6, is located above first slider 14. Section 19 has four supports 20, 22, 23a and 23b. First support 20 can move up and down, along the Z-axis. Second support 22 is connected to first support 20 by pivot 22a and can swing with respect to first support 20. Third and fourth supports 23a and 23b located above second supports 22. Although supports 23a and 23b are shown as if they were spaced apart, support 23a is mounted on support 23b and fastened to support 23b by means of bolts 23c such that the rear end of fork 6 (not shown) is clamped between supports 23a and 23b. The rear ends of both supports 23a and 23b are aligned with the rear end of fork 6. Fourth support 23b is fastened to second support 22 by means of bolts 23d. The rear end of second support 22 is located more rearwardly than the rear ends of supports 23a and 23b.

Eccentric cam 21 abuts the upper surface of the rear end of second support 22. Cam 21 is rotatably supported between a pair of brackets 21a. One end of cam 21 is coupled to shaft 21b, which is coupled to the shaft of motor 25 by means of a speed-reducing mechanism (not shown). A pressure sensor (not shown) is interposed between cam 21 and one of brackets 21a, for detecting the moment of force transmitted from cam 21 to bracket 21a.

Figure 3:
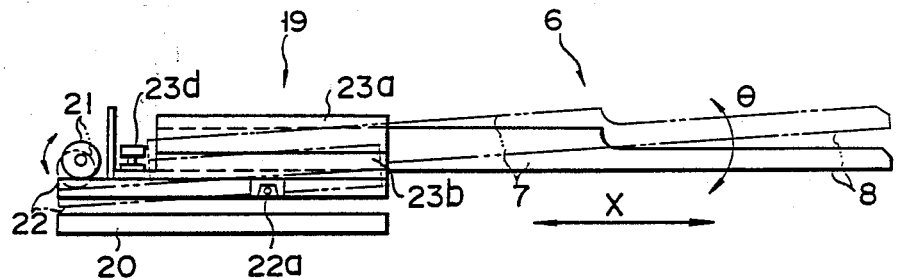
FIG. 3 is a side view of a mechanism (i.e., a $\theta$ drive mechanism) incorporated in the soft-landing loader, for oscillating the fork.

Soft-landing loader 5 has a $\theta$-oscillation mechanism for oscillating fork 6 up and down. As is shown in FIG. 3, the $\theta$-oscillation mechanism is a lever mechanism whose fulcrum is shaft 22a. It receives a force at the junction between cam 21, and exerts a force at boat-supporting portion 8. Boat-supporting portion 8 swings vertically when cam 21 is rotated.

Figure 4:
FIGS. 4, 5 and 6 are diagrams explaining the various positions the fork takes with respect to a process tube during the use of the soft-landing loader.
Figure 5:
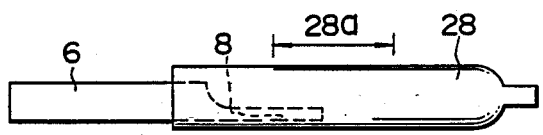
Figure 6:
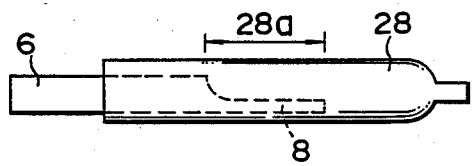
Figure 7:
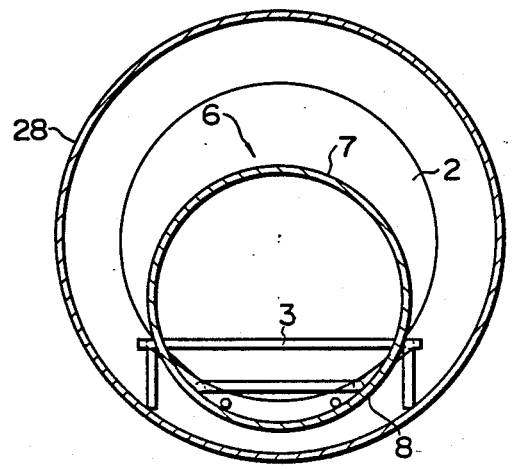
FIG. 7 is a cross-sectional view showing the process tube, and the fork and wafer boat of the loader, both inserted within the process tube.

Now, with reference to FIGS. 4 to 6, it will be explained how fork 6 is loaded into process tube 28 by means of soft-landing loader 5. First, as is shown in FIG. 4, fork 6 is located in such a position that boat-supporting portion 8 is located facing the inlet port of process tube 28. As fork 6 is moved toward process tube 28, portion 8 is inserted into process tube 28 as is illustrated in FIG. 5. Fork 6 is stopped the moment boat-supporting portion 8 reaches section 28a of process tube 28, where heat is uniformly applied to wafers 2 mounted on boat 3, as is shown in FIG. 6. Thus, wafer boat 3 (not shown in FIG. 4, 5 or 6) has been loaded into process tube 28, and wafers 2 can be heat-treated. When wafer boat 3 is located within process tube 28, each wafer 2 is placed substantially concentric with process tube 28, as can be understood from FIG. 7.

Figure 8:
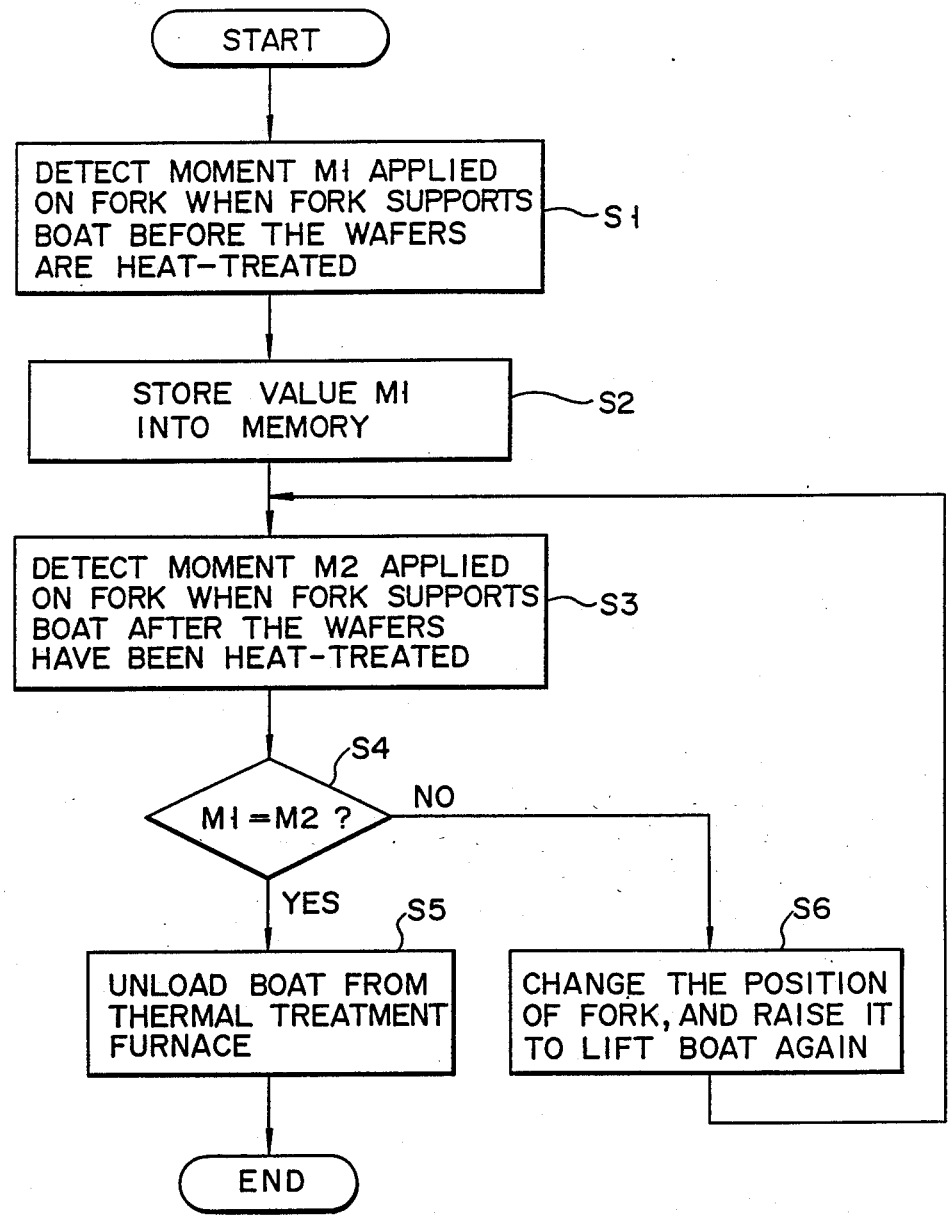
FIG. 8 is a flow chart explaining how the soft-landing loader shown in FIG. 2 performs its function.

With reference to the flow chart of FIG. 8 and also with FIGS. 9 to 14, it will be described how each soft-landing loader 5 is operated to load wafer boat 3 into, and then unload wafer boat 3 out of, process tube 28.

Wafer boat 3, on which a number of silicon wafers 2 are mounted, is transferred from the boat-transferring member 9b of elevator 9 to the boat-supporting portion 8 of fork 6. The total weight of wafers 2 and boat 3 is about 5~10 kg, and the length of fork 6 is 200~300 cm. The power switch of soft-landing loader 5 is turned on, thus bringing loader 5 into an operative condition.

Figure 9:
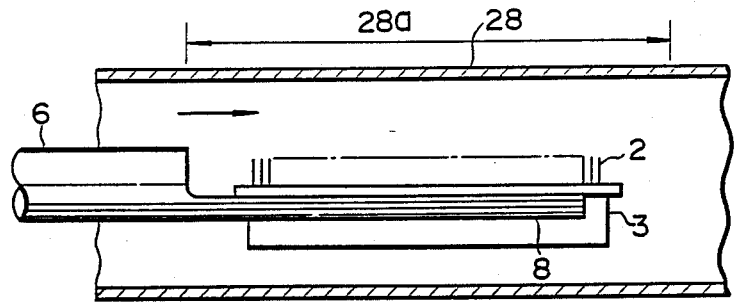
FIGS. 9, 10, and 11 are diagrams explaining how the loader operates, loading the wafer boat into the process tube.
Figure 10:
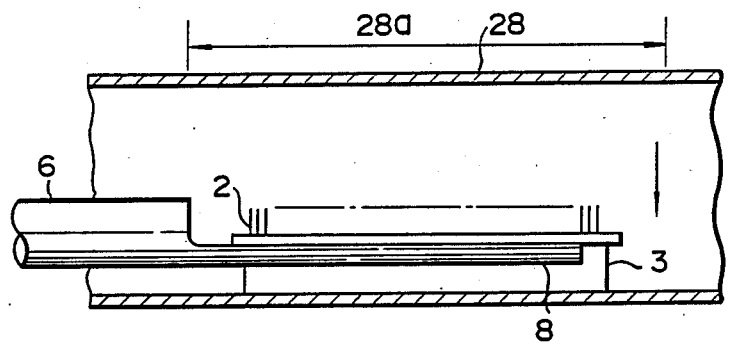

In step S1, the pressure sensor interposed between cam 21 and bracket 21a detects the reaction M1 applied to the junction between cam 21 and second support 22 when fork 6 supports one end of wafer boat 3. The value M1, thus detected, is stored in a memory incorporated in a computer system, in step S2. Then, fork 6 is moved in the X-axis direction until boat-supporting portion 8 reaches section 28a of process tube 28 as is shown in FIG. 9. Motor 25 of the $\theta$-oscillation mechanism is driven, thereby rotating eccentric cam 21 by a predetermined angle. As a result, boat-supporting portion 8 is lowered within tube 28, as is illustrated in FIG. 10, thus mounting wafer boat 3 within tube 28.

Figure 11:
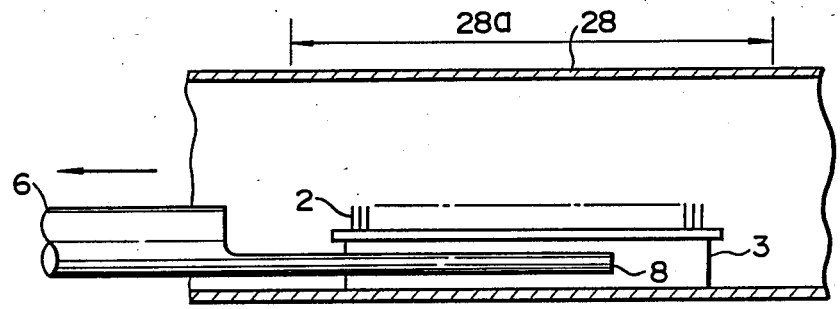

Then, as is shown in FIG. 11, fork 6 is pulled out of process tube 28, leaving wafer boat 3 within tube 28. The entrance 1a of thermal treatment furnace 1 is then closed. Wafers 2 mounted on boat 3 are heated at a prescribed temperature for a predetermined time in an specific oxidizing atmosphere. The surfaces of each wafer 2 are therefore oxidized, and an impurity is diffused into the wafer.

After this heat treatment is completed, the entrance 1a of furnace 1 is opened, and fork 6 is inserted into process tube 28 until the distal end portion of fork 6 is placed below wafer boat 3 as is illustrated in FIG. 12. Then, as is shown in FIG. 13, fork 6 is moved up, thus lifting wafer boat 3. The pressure sensor detects the reaction M2 applied to the junction between cam 21 and second support 22, in step S3. The total weight of wafers 2 and boat 3 is different from the weight measured before wavers 2 are subjected to the heat treatment. For example, when heat treatment is applied to 150 wafers having a diameter of 5 inches, thereby forming a 1 $\mu$m polysilicon layer on each wafer, the total weight of wafers increases about 12 grams. This increase is, however, negligible in comparison with the total weight of the wafers and boat 3, and virtually does not influence the reaction M2. What affects the reaction M2 greatly is the changes in the position of wafer boat 3. That is, the value M2 is either more or less than the value M1 when the position of boat 3 changes with respect to fork 6 after the heat treatment. Such a change of position of boat 3 must be eliminated. Otherwise, wafer boat 3 cannot be easily transported to the position where the wafers mounted on it will undergo the next processing.

Therefore, in step S4, it is determined whether or not value M2 is equal to value M1 stored in the memory. If YES, that is, if the position of boat 3 has not changed after the heat treatment with respect to fork 6, fork 6 is pulled out of process tube 28 in step S5. If NO, fork 6 is lowered in step S6, thus placing boat 3 on the inner wall of tube 28. Fork 6 is then slightly moved in the X-axis direction, and again moved up to hold boat 3 at a different position. Step S3, S4, and S6 are repeated until value M2 becomes equal to value M1. When value M2 is at last found equal to value M1, the operation goes to step S5, and wafer boat 3 is unloaded from process tube 28.

The present invention is not limited to the embodiment described above. For example, the pressure sensor can be replaced by a stain gage which is attached to second support 22 for detecting a change in the strain of support 22, which represents a positional change of wafer boat 3 with respect to fork 6. Further, $\theta$-oscillation mechanism may be replaced by a crank mechanism.

Since the fork holds the wafer boat within the process tube such that each wafer mounted on the boat is located almost concentric to the wafer boat, the wafer does not make contact with the inner wall of the process tube. Therefore, there is no possibility that the wafers are broken when being loaded into, or unloaded from, the process tube. Nor is there any chance that quartz powder comes off the inner wall of the process tube to reduce the cleanness of the wafer-processing room. Moreover, since the wafer boat takes the same position with respect to the fork, before it is loaded into the process tube and also after it has been unloaded from the tube, the wafers which have been heat-treated in the thermal treatment furnace can be transferred correctly by a robot to the apparatus for performing the next process on the wafers.

What is claimed is:

1. A method of carrying an object into and from a thermal treatment furnace, said method comprising the steps of:

measuring a first physical transformation amount applied on a loading/unloading means supporting the object before the object is loaded into the thermal treatment furnace:

measuring a second physical transformation amount being applied on the loading/unloading means after wafers mounted on the object have been thermally treated in the furnace;

comparing the second physical transformation amount with the first physical transformation amount;

changing the position at which the object is mounted on the loading/unloading means, until the second physical transformation amount becomes equal to the first physical transformation amount; and unloading the object from the thermal treatment furnace after the second physical transformation amount has become equal to the first physical transformation amount.

2. The method according to claim 1, wherein said object is a boat supporting a number of semiconductor wafers.

3. The method according to claim 1, wherein said physical transformation amount is the reaction applied on a specific point of said loading/unloading means.

4. The method according to claim 3, wherein said reaction is measured by a pressure sensor.

5. The method according to claim 1, wherein said physical transformation amount is the strain generated in said loading/unloading means.

6. The method according to claim 5, wherein said strain is measured by a strain gage.

7. The method according to claim 1, wherein said first physical transformation amount is stored in a memory incorporated in a computer system, and is compared with said second physical transformation amount, whenever necessary, and the position at which said loading/unloading means supports the object is corrected in accordance with the difference with the first and second physical transformation amounts.

8. An apparatus for carrying an object into and from a thermal treatment furnace, said apparatus comprising:

loading/unloading means for loading an object into, and unloading an object from, the thermal treatment furnace;

physical transformation amount-measuring means for measuring a first physical transformation amount applied on a loading/unloading means supporting the object before the object is loaded into the furnace, and also measuring a second physical transformation amount being applied on the loading/unloading means after wafers mounted on the object have been thermally treated in the furnace;

comparing means for comparing the second physical transformation amount with the first physical transformation amount; and position-changing means for changing the position at which the object is mounted on the loading/unloading means, until the second physical transformation amount becomes equal to the first physical transformation amount, said loading/unloading means unloading the object from the thermal treatment furnace after the second physical transformation amount has become equal to the first physical transformation amount.

9. The apparatus according to claim 8, wherein said loading/unloading means is a soft-landing loader having a cantilever for supporting one end of said object, an X-axis drive mechanism for moving the cantilever back and forth, and a $\theta$-oscillation mechanism for oscillating the cantilever.

10. The apparatus according to claim 9, wherein said cantilever has a supporting portion for supporting said object, said supporting portion being made of partial cut off cylindrical refractory material.

11. The apparatus according to claim 9, wherein said X-axis drive mechanism has a drive shaft extending the length-wise direction of said cantilever, means for rotating the drive shaft, a slider supporting said cantilever, and means for converting the rotation of the drive shaft to the linear motion of the slider.

12. The apparatus according to claim 9, wherein said $\theta$-oscillation mechanism is a lever mechanism.

13. The apparatus according to claim 12, wherein said lever mechanism includes an eccentric cam located at a point at which a reaction is applied to the lever mechanism.

14. The apparatus according to claim 9, wherein said X-axis drive mechanism and said $\theta$-oscillation mechanism are controlled by means of a computer system.

15. The apparatus according to claim 8, wherein said physical transformation amount-measuring means is a pressure sensor.

16. The apparatus according to claim 8, wherein said physical transformation amount-measuring means is a strain gage.

* * * * *